(12) United States Patent
Seo et al.

(10) Patent No.: US 11,204,587 B2
(45) Date of Patent: Dec. 21, 2021

(54) HOLOGRAPHIC DISPLAY APPARATUS

(71) Applicant: SAMSUNG ELECTRONICS CO., LTD., Suwon-si (KR)

(72) Inventors: Wontaek Seo, Yongin-si (KR);
Hongseok Lee, Seoul (KR);
Byunghoon Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 315 days.

(21) Appl. No.: 16/385,471

(22) Filed: Apr. 16, 2019

(65) Prior Publication Data
US 2020/0150588 A1    May 14, 2020

(30) Foreign Application Priority Data

Nov. 8, 2018    (KR) ................. 10-2018-0136804

(51) Int. Cl.
*G03H 1/22* (2006.01)
*G03H 1/02* (2006.01)
*H01S 5/183* (2006.01)

(52) U.S. Cl.
CPC ............ *G03H 1/2294* (2013.01); *G03H 1/02* (2013.01); *H01S 5/183* (2013.01); *G03H 2001/0212* (2013.01); *G03H 2001/0224* (2013.01); *G03H 2210/22* (2013.01)

(58) Field of Classification Search
CPC .............. G03H 1/2294; G03H 1/02; G03H 2001/0212; G03H 2210/22; G03H 2001/0224; G03H 2001/2271; G03H 2222/18; G03H 1/2286; G03H 1/32; G03H 2222/34; G03H 2001/221; H01S 5/183; H01S 5/4087; H01S 5/423; H01S 5/04256; G02B 27/0093; G02B 27/0172; G02B 27/0174
See application file for complete search history.

(56) References Cited

U.S. PATENT DOCUMENTS

| | | | |
|---|---|---|---|
| 6,950,454 B2 | 9/2005 | Kruschwitz et al. | |
| 7,252,394 B1 | 8/2007 | Fu | |
| 7,471,706 B2 | 12/2008 | Bass et al. | |
| 8,192,029 B2 | 6/2012 | Takeda et al. | |
| 9,442,294 B2 | 9/2016 | Urey | |
| 9,851,568 B2 | 12/2017 | Theytaz | |
| 10,088,803 B2 | 10/2018 | Seo et al. | |
| 2007/0297750 A1* | 12/2007 | Bass | G09G 3/3208 385/147 |

(Continued)

FOREIGN PATENT DOCUMENTS

| JP | 4483840 B2 | 6/2010 |
|---|---|---|
| KR | 10-2016-0099568 A | 8/2016 |
| KR | 10-1826962 B1 | 2/2018 |

*Primary Examiner* — Kimberly N. Kakalec
(74) *Attorney, Agent, or Firm* — Sughrue Mion, PLLC

(57) ABSTRACT

Provided is a holographic display apparatus. A holographic image display apparatus includes: a light source configured to emit light, the light source including a plurality of vertical-cavity surface-emitting lasers (VCSELs) that are spaced apart from one another; a spatial light modulator configured to, based on a hologram data signal, modulate the light emitted by the light source; and a focusing optical system configured to focus an image formed by the spatial light modulator using a Maxwellian view method.

18 Claims, 8 Drawing Sheets

(56) References Cited

U.S. PATENT DOCUMENTS

| | | | |
|---|---|---|---|
| 2011/0002019 A1* | 1/2011 | Routley | H04N 9/3161 |
| | | | 359/9 |
| 2016/0279707 A1 | 9/2016 | Mattes et al. | |
| 2016/0327365 A1 | 11/2016 | Collin et al. | |
| 2017/0299869 A1* | 10/2017 | Urey | G02B 27/48 |
| 2019/0324272 A1 | 10/2019 | Seo et al. | |

* cited by examiner

HOLOGRAPHIC DISPLAY APPARATUS

CROSS-REFERENCE TO RELATED APPLICATION

This application claims priority from Korean Patent Application No. 10-2018-0136804, filed on Nov. 8, 2018, in the Korean Intellectual Property Office, the disclosure of which is incorporated by reference herein in its entirety.

BACKGROUND

1. Field

Example embodiments of the present disclosure relate to holographic apparatuses, and more particularly, to holographic apparatuses including vertical-cavity surface-emitting lasers (VCSELs).

2. Description of the Related Art

As a method of implementing a holographic image, a spectacle method and a spectacle-free method are commercially available. The spectacle method is categorized into a polarizing spectacle method and a shutter spectacle method, and the spectacle-free method is categorized into a lenticular method and a parallax barrier method. These methods use the binocular parallax of the two eyes. However, in this case, the increase in the number of viewpoints is limited and the viewer feels fatigue because the depth perception recognized by the brain does not match with the focus of the eye.

Recently, a holographic display method is practically used. In the holographic display method, depth perception recognized by the brain matches with the focal point of the eyes, and full parallax is embodied. The holographic display method utilizes the principle that an image of an original object is reproduced when reference light is diffracted by radiation thereof onto a holographic pattern which has been obtained by the interference of object light reflected from the original object with the reference light. According to commercially available holographic display methods, a computer-generated hologram (CGH) is provided as an electrical signal to a spatial light modulator, rather than directly exposing the original object, to obtain a hologram pattern. The spatial light modulator forms a hologram pattern based on the input CGH signal and the reference light is applied to the spatial light modulator and diffracted to generate a holographic image.

However, to implement a complete holographic display scheme, a very high-resolution spatial light modulator and very high data throughput are required. In recent years, a binocular hologram method has been proposed in which a holographic image is provided only to a viewing area corresponding to the eyes of a viewer in order to reduce the required data throughput and resolution. For example, only a holographic image having a viewpoint corresponding to the viewer's left-eye viewing area and a holographic image having a viewpoint corresponding to the viewer's right-eye viewing area are generated and these holographic images are provided to the viewer's left eye and right eye, respectively.

The holographic display method described above may be implemented as a head mount display. The head-mounted display device may use a small-sized light source, which causes speckle noise.

SUMMARY

Example embodiments provide holographic display apparatuses with reduced image noise.

Additional aspects will be set forth in part in the description which follows and, in part, will be apparent from the description, or may be learned by practice of the presented embodiments.

In accordance with an aspect of an example embodiment, there is provided a holographic image display apparatus including: a light source configured to emit light, the light source including a plurality of vertical-cavity surface-emitting lasers (VCSELs) that are spaced apart from one another; a spatial light modulator configured to, based on a hologram data signal, modulate the light emitted by the light source; and a focusing optical system configured to focus an image formed by the spatial light modulator using a Maxwellian view method.

The light source may be configured to output power of 20 mW or more.

At least one VCSEL of the plurality of VCSELs may be configured to output power in a range of 5 µW to 5 mW.

The light source may have a cross-section in a shape of a circle with a diameter of 500 µm or less.

At least one VCSEL of the plurality of VCSELs may have a cross-section in a shape of a circle with a diameter of 5 µm or more and 50 µm or less.

At least some VCSELs of the plurality of VCSELs may be arranged in at least one of a polygon shape, an ellipse shape, a circle shape, and a shape of concentric circles.

Each VCSEL of the plurality of VCSELs may be configured to emit light having a wavelength that is different from a wavelength of light emitted by at least two neighboring VCSELs.

The plurality of VCSELs may include: a plurality of first VCSELs configured to emit light having a first wavelength; a plurality of second VCSELs configured to emit light having a second wavelength, the second wavelength being different from the first wavelength; and a plurality of third VCSELs configured to emit light having a third wavelength, the third wavelength being different from the first wavelength and the second wavelength.

The first wavelength, the second wavelength, and the third wavelength may be a red wavelength, a green wavelength, and a blue wavelength, respectively.

The plurality of first VCSELs, the plurality of second VCSELs, and the plurality of third VCSELs may be arranged to emit light to produce a white balance.

The light source may include a region in which the first VCSELs, the second VCSELs, and the third VCSELs are arranged such that a sequence of a first VCSEL from among the plurality of first VCSELs, a second VCSEL from among the plurality of second VCSELs, and a third VCSEL from among the plurality of third VCSELs is repeated in one direction.

A portion of a first region including the plurality of first VCSELs may overlap a portion of a second region including the plurality of second VCSELs, and the first region may not overlap a third region including the plurality of third VCSELs.

A distance between a center of the first region and a center of the second region may be proportional to a difference between the first wavelength and the second wavelength.

The first region, the second region, and the third region may be sequentially arranged in one direction.

The focusing optical system may include: a first lens; a second lens; and a spatial filter between the first lens and the second lens.

The light source may further include: a first light source including a plurality of first VCSELs spaced apart from each other; and a second light source including a plurality of second VCSELs spaced apart from each other, and wherein the holographic display apparatus further may further include: an eye-tracking sensor; and a processor configured to select one of the first light source and the second light source based on a detection result obtained by the eye-tracking sensor and operate the selected one of the first light source and the second light source.

The focusing optical system may be configured to focus a first image formed based on light emitted from the first light source on a first position on a focal plane, and focus a second image formed based on light emitted from the second light source on a second position on the focal plane, the second position being different from the first position.

A distance between the first position and the second position may be 2 mm or greater and 10 mm or less.

The focusing optical system may further include an image converging element configured to focus a first image of an external environment and a second image formed by the spatial light modulator.

The holographic display apparatus may be a head mount display.

BRIEF DESCRIPTION OF THE DRAWINGS

The above and other aspects will become apparent and more readily appreciated from the following description of example embodiments, taken in conjunction with the accompanying drawings, in which.

DETAILED DESCRIPTION

Figure 1:
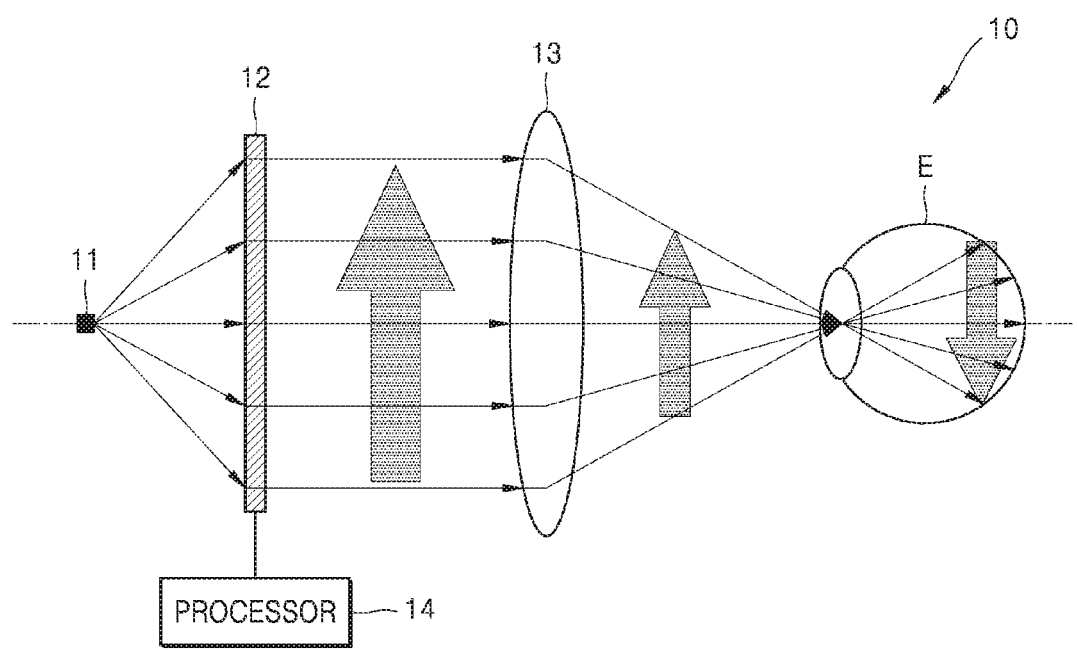
FIG. 1 shows a view showing an optical arrangement of a holographic display apparatus according to an embodiment.

Hereinafter, holographic display apparatuses according to example embodiments will be described in detail with reference to the accompanying drawings. The widths and thicknesses of the layers or regions illustrated in the accompanying drawings may be somewhat exaggerated for clarity and ease of description. Like reference numerals designate like elements throughout the specification.

The terms "include" and "comprise" should not be construed as necessarily including the elements or operations described in the specification, and some of the elements and operations may not be included, or additional elements or operations may be further included.

The terms "above" or "on" may include not only being in direct contact with an element but also being in non-contact with the element.

The terms "first", "second", etc. may be used to describe various components, but the components should not be limited by the terms. Terms are used only for the purpose of distinguishing one component from another.

Also, terms such as "portion," "module," etc. used herein indicate a unit for processing at least one function or operation, in which the unit and the block may be embodied as hardware or software or may be embodied by a combination of hardware and software.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 shows a view showing an optical arrangement of a holographic display apparatus 10 according to an example embodiment. Referring to FIG. 1, the holographic display apparatus 10 includes a light source 11 providing light, a spatial light modulator 12 configured to modulate light from the light source 11 based on a hologram data signal, and a focusing optical system 13 configured to focus an image formed by the spatial light modulator according to a Maxwellian view method.

The light source 11 may provide coherent light. The light source 11 may include a plurality of vertical-cavity surface-emitting lasers (VCSELs) spaced apart from one another. Since a plurality of VCSELs are arranged in a small aperture, light emitted from the light source 11 is not time-coherent.

The spatial light modulator 12 may form a hologram pattern configured to modulate the incident reference light by diffraction thereof based on a hologram data signal provided by a processor 14. The spatial light modulator 12 may include a phase modulator capable of only performing phase modulation, an amplitude modulator capable of only performing amplitude modulation, or a complex modulator capable of performing both phase modulation and amplitude modulation. Although the spatial light modulator 12 illustrated in FIG. 1 is a transmissive spatial light modulator, the spatial light modulator 12 may also be a reflective spatial light modulator. When the spatial light modulator 12 is a transmissive spatial light modulator, the spatial light modulator 12 may include, for example, a semiconductor modulator based on a compound semiconductor such as GaAs, or a liquid crystal device (LCD). When the spatial light modulator 12 is a reflective spatial light modulator, the spatial light modulator 12 may include, for example, a digital micromirror device (DMD), a liquid crystal on silicon (LCoS), or a semiconductor modulator.

The focusing optical system 13 focuses the image generated by the spatial light modulator 12 on a certain space. The focusing optical system 13 is illustrated as one lens but is not limited thereto. In one or more example embodiments, the focusing optical system 13 may include a plurality of lenses.

The focusing optical system 13 may include a Maxwellian view optical system. That is, the focusing optical system 13 may focus image information on a point in the pupil so as to allow the image information to be scanned on the retina.

The operation of the holographic display apparatus 10 is as follows. First, the processor 14 generates a hologram data signal and provides the generated hologram data signal to the spatial light modulator 12. The hologram data signal may be a computer generated hologram (CGH) signal that has been calculated such that the target holographic image is reproduced in space. The processor 14 may generate a hologram data signal corresponding to a holographic image to be reproduced. The spatial light modulator 12 may generate a hologram pattern on the surface of the spatial light modulator 12 according to the hologram data signal provided from the processor 14. The principle based on which the spatial light modulator 12 generates a hologram pattern may be the same as, for example, the principle based on which a display panel displays an image. For example, the hologram pattern may be displayed on the spatial light modulator 12 as an interference fringe pattern containing information about a holographic image to be reproduced.

At the same time, the light source 11 provides reference light to the spatial light modulator 12. When the reference light is diffracted by the hologram pattern formed on the spatial light modulator 12, a three-dimensional holographic image may be reproduced in a certain space in front of the spatial light modulator 12. The viewer may view the holographic image at the position where the holographic image is displayed. At the position where the holographic image is displayed, a virtual plane containing the pupil of the viewer may be referred to as the pupil plane.

However, since a spatial light modulator which performs only one of a phase modulation and an amplitude modulation includes an array of a plurality of pixels, the array of the plurality of pixels functions as a lattice. Therefore, the reference light is diffracted not only by the hologram pattern formed by the spatial light modulator 12 but also by the pixel lattice including the array of pixels of the spatial light modulator 12. In addition, some of the reference light passes through the spatial light modulator 12 without being diffracted by the hologram pattern. As a result, many lattice spots appear on the pupil plane of the viewer where the holographic image is gathered into a point. These multiple lattice spots act as image noise that degrades the quality of the holographic image and makes viewing of the holographic image (HI) uncomfortable.

The lattice spots may be proportional to the size of the light source 11. Thus, to reduce noise caused by lattice spots, the size of the light source 11 may be relatively small. The light source 11 according to one or more example embodiments may have a cross-section in the shape of a circle and may have a diameter of about 500 μm or less. For example, when a holographic display apparatus according to an example embodiment is a spectacle-type apparatus, the diameter of the light source 11 may be about 500 μm or less; and when the holographic display apparatus is a spectacle-free apparatus, the diameter of the light source 11 may be about 200 μm or less. Herein, the cross-section of the light source 11 is not limited to a circle but may be other shapes. When the cross-section of the light source 11 is not a circle, the longest distance of the cross-section of the light source 11 may be called the diameter.

On the other hand, when the light source 11 has low output power, the luminance of the image may be reduced. In one or more example embodiments, the light source 11 may have high output power. The light source 11 according to one example embodiment may have an output power of at least about 20 mW. In particular, when the holographic display apparatus is a spectacles-type apparatus, the output power of the light source 11 may be about 20 mW or more, and when the holographic display apparatus is a spectacle-free apparatus, the output power of the light source 11 may be about 1 W or more.

The light source 11 may emit light that has a relatively low level of speckle phenomenon. Highly time-coherent light may produce images with speckle. Thus, to reduce time-coherence, the light source 11 may include a plurality of sub-light sources. A laser diode may be used as the light source 11. However, the laser diode produces speckle noise although output power thereof is strong. A light-emitting diode, for use as the light source 11, has relatively weak output power although producing a low level of speckle noise.

The light source 11 according to one or more example embodiments may include VCSELs spaced apart from each other. The expression "being spaced apart" refers to the configuration that light emitted by a VCSEL does not overlap with light emitted by neighboring VCSELs. The diameter of each of the VCSELs may be about 5 μm or more and about 50 μm or less, and the output power thereof may be in the range of about 3 μW/unit to about 5 mW/unit. The output power may vary depending on the wavelength output by a VCSEL. For example, a VCSEL that outputs red-wavelength light may output power of about 2 mW/unit to about 5 mW/unit, a VCSEL that outputs green-wavelength light may output power of about 3 mW/unit to about 8 μW/unit, and a VCSEL that outputs blue-wavelength light may output power of about 0.9 mW/unit to about 1.5 mW/unit.

Tens to hundreds of the above-described VCSELs may be arranged in one light source. Accordingly, even when a single VCSEL emits time-coherent light, since tens or hundreds of VCSELs in the light source 11 emit light, light overlaps and time coherence does not occur, and speckle is not observed by the viewer.

From this point of view, the holographic display apparatus 10 using the light source 11 including a plurality of VCSELs spaced apart from each other may reproduce images with reduced noise.

Figure 2:
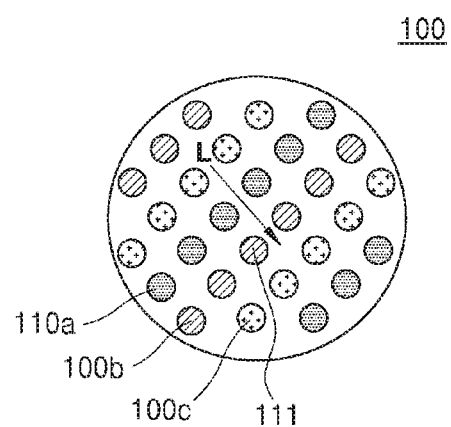
FIG. 2 shows a view illustrating a light source applied to the holographic display apparatus of FIG. 1 according to an example embodiment.

FIG. 2 shows a view illustrating a light source 100 applied to the holographic display apparatus of FIG. 1. Referring to FIG. 2, the light source 100 includes a plurality of first VCSELs 110a emitting a first wavelength of light, a plurality of second VCSELs 110b emitting a second wavelength of light, the second wavelength being different from the first wavelength, and a plurality of third VCSELs 110c emitting a third wavelength of light, the third wavelength being different from the first and second wavelengths. The first, second, and third wavelengths may be red, green, and blue wavelengths, respectively. However, the first, second, and third wavelengths are not limited thereto. The light source 100 may include a plurality of VCSELs emitting white light having a plurality of different wavelength bands as a whole.

The first, second, and third VCSELS 110a, 110b, and 110c included in the light source 100 may be arranged to emit light to produce a white balance. For example, the first VCSELs 110a emitting the first wavelength of light, the second VCSELs 110b emitting the second wavelength of light, and the third VCSELs 110c emitting the third wavelength of light may be sequentially arranged in one direction L to produce the white balance. In other words, a sequence of a first VCSEL, a second VCSEL, and a third VCSEL may repeat in the L direction. In one or more example embodiments, to produce the white balance, at least two of the neighboring first, second, and third VCSELs 110a, 110b, and 110c may emit light having different wavelengths. For example, referring to FIG. 2, there are eight VCSELs adjacent to a VCSEL 111, and six VCSELs thereof may emit light having a wavelength that is different from that of the VCSEL 111. In FIG. 2, the VCSELs are shown to be arranged in a rhombic shape, but the shape of the arrangement of the VCSELs is not limited thereto.

Figure 3A:
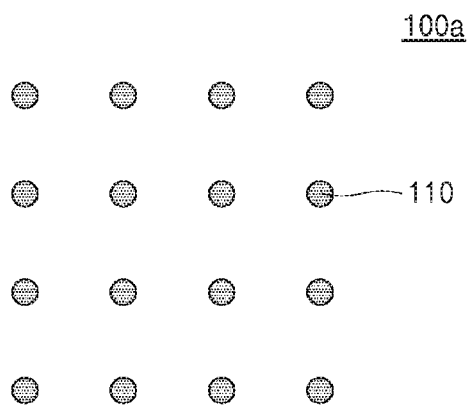
FIGS. 3A, 3B, and 3C are views illustrating an arrangement of vertical-cavity surface-emitting lasers (VCSELs) according to example embodiments.
Figure 3B:
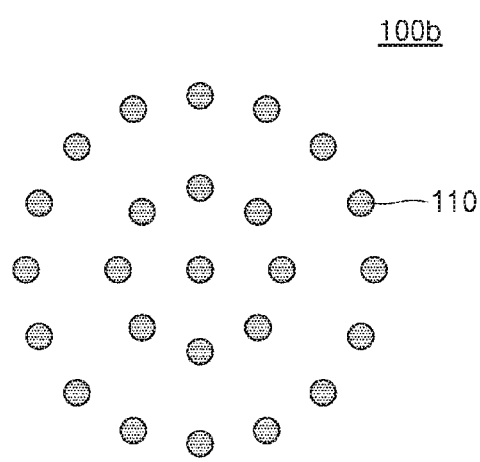
Figure 3C:
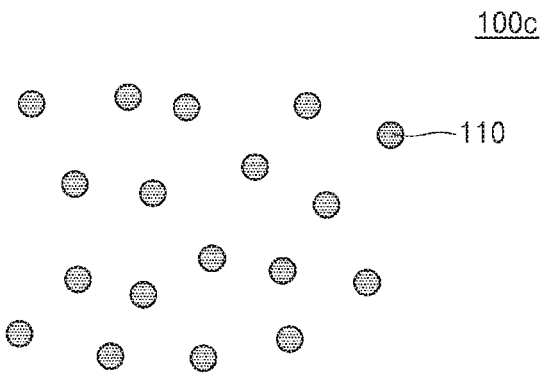

FIGS. 3A, 3B, and 3C are views illustrating an arrangement of VCSELs according to example embodiments. As shown in FIG. 3A, VCSELs 110 may be arranged in a rectangular shape, and as shown in FIG. 3B, arranged concentrically (i.e., in a shape of concentric circles). Alternatively, as shown in FIG. 3C, the VCSELs 110 may be arranged in any shape or in no particular shape. However, the number and arrangement of VCSELs may be selected to produce the white balance. In one or more example embodiments, VCSELs may be arranged in various shapes such as a polygonal shape, a circular shape, an elliptical shape, and the like other than the rectangular shape.

As described above, due to pixel grids, the spatial light modulator 12 generates a plurality of lattice spots in addition to the holographic image. To prevent such lattice spots from being visible to the viewer, the holographic display apparatus may reproduce the holographic image in such a way that the focus of the holographic image does not overlap with lattice spots on the pupil plane. Since lattice spots are generated by the internal structure of the spatial light modulator 12 and are not associated with the hologram pattern, the positions of lattice spots are constantly fixed in the pupil plane.

On the other hand, since the focal position of the holographic image on the pupil plane is determined by the hologram pattern formed by the spatial light modulator 12, the hologram pattern may be formed such that the holographic image is reproduced at a position where there are no lattice spots so that lattice spots are not visible to a viewer. Such a hologram reproducing method is called an off-axis method. In this case, when the viewer places the pupil at the center of the focal position of the holographic image and views the holographic image, the noise image due to the lattice spots becomes invisible or less visible.

To adjust the focal position of the holographic image in the above-described manner, the spatial light modulator 12 may further produce a periodic diffraction pattern for adjusting the focal position of the holographic image, together with the hologram pattern including information about the holographic image to be reproduced. To this end, the processor 14 may generate a diffraction pattern data signal in addition to a hologram data signal and provide the generated diffraction pattern data signal to the spatial light modulator 12. The traveling direction of the incident reference light is deflected by the periodic diffraction pattern displayed on the spatial light modulator 12. Accordingly, the focal position of the holographic image may be displaced from the lattice spots. Such a periodic diffraction pattern that deflects the traveling direction of light acts as a prism. Accordingly, the periodic diffraction pattern may be referred to as a prism grating. The degree to which the focal position of the holographic image moves may be dependent on the period of the periodic diffraction pattern.

A periodic diffraction pattern P may include x-direction lattice lines and y-direction lattice lines. The periodic diffraction pattern P may have an x-direction period Λx and a y-direction period Λy that are dependent on the wavelength of incident light. Herein, the x-direction period Λx is an interval in the x-direction between lattice lines constituting the diffraction pattern P, and the y-direction period Λy is an interval in the y-direction between lattice lines constituting the diffraction pattern P.

In order to realize a color holographic image, the light source 11 may provide white reference light including red light, green light, and blue light. The holographic pattern displayed on the spatial light modulator 12 may include a component that diffracts red light to reproduce a red holographic image, a component that diffracts green light to reproduce a green holographic image, and a component that diffracts blue light to reproduce a blue holographic image When the red, green, and blue holographic images are reproduced at the same position on the holographic image plane, a color holographic image may be realized.

Further, since the x-direction period Λx and the y-direction period Λy depend on the wavelength of light, when the color hologram image is implemented, the diffraction pattern may include three kinds of diffraction patterns having different periods.

Figure 4:
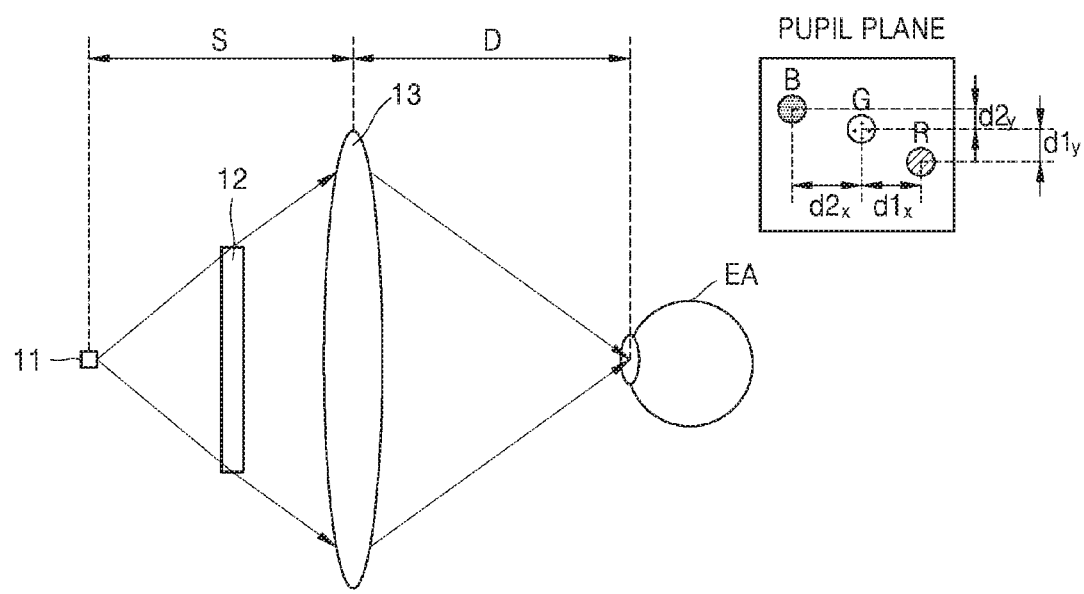
FIG. 4 shows a diagram showing an example of a position where a diffraction pattern for each color is generated when the average center points of sub-light sources for each color are the same.

The presence of the prism grating causes light emitted by sub-light sources for red, green, and blue color to travel in different directions according to wavelength. FIG. 4 shows a diagram showing an example of a position where a diffraction pattern for each color is generated when the average center points of sub-light sources for red, green, and blue color are the same (i.e., when the sub-light sources of the respective colors are all dispersed about the same central point). In the light source 11, when the average center points of sub-light sources for red, green, and blue color are the same, since the period of the color diffraction pattern depends on the wavelength, the position of the lattice spots in the pupil plane for each color differs.

For example, the displacement between red lattice spots and green lattice spots at the pupil position is expressed by Equation 1, and the displacement between green lattice spots and blue lattice spots is expressed by Equation 2.

$$d1_x = \frac{D}{\Lambda_x}(\lambda_R - \lambda_G),$$
$$d1_y = \frac{D}{\Lambda_y}(\lambda_R - \lambda_G)$$
[Equation 1]

wherein Λx refers to the x-direction period of the prism grating generated by the spatial light modulator 12, Λy refers to the y-direction period of the prism grating generated by the spatial light modulator 12, and D refers to the distance between the focusing optical system 13 and the pupil plane.

$$d2_x = \frac{D}{\Lambda_x}(\lambda_G - \lambda_B),$$
$$d2_y = \frac{D}{\Lambda_y}(\lambda_G - \lambda_B)$$
[Equation 2]

The chromatic dispersion of the diffraction pattern may act as noise to the image. To prevent chromatic dispersion of the diffraction pattern, the center points of the VCSELs for each color may be arranged not to overlap.

Figure 5:
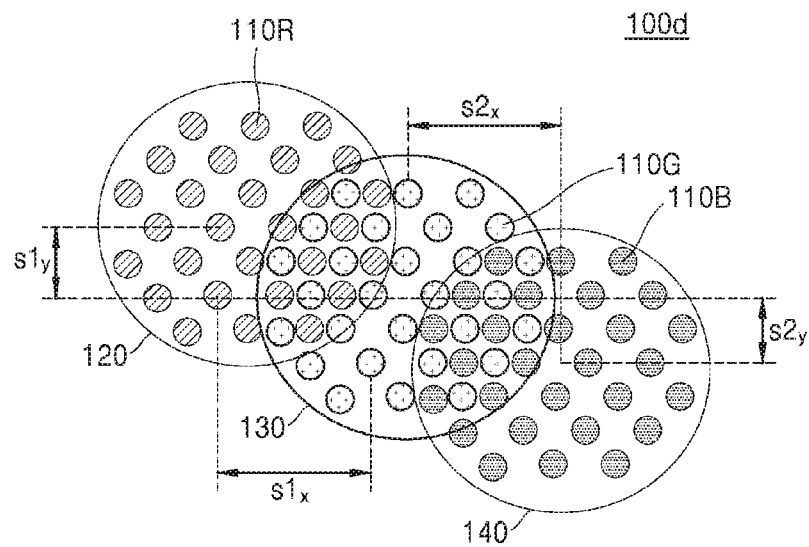
FIG. 5 is a diagram showing an arrangement relationship of VCSELs for red, green, and blue color according to an example embodiment.

FIG. 5 is a diagram showing an arrangement relationship of VCSELs for each color according to an example embodiment. Referring to FIG. 5, the light source 11 may include a first region 120 including a plurality of first VCSELs 110R emitting a first wavelength of light, a second region 130 including a plurality of second VCSELs 110G emitting a second wavelength of light, and a third region 140 including a plurality of third VCSELs 110B emitting a third wavelength of light. The first, second, and third wavelengths may be red, green, and blue wavelengths, respectively. Each of the first VCSELs 110R, the second VCSELs 110G, and the third VCSELs 110B may emit light having a different color of wavelength to produce a white balance, in addition to light having a corresponding color of wavelength. The first region 120, the second region 130, and the third region 140 may be sequentially arranged in one direction as shown, for example, in FIG. 5. The displacement among the first region 120, the second region 130, and the third region 140 may be in the opposite direction to a diffraction pattern for each color. A portion of the first region 120 and a portion of the second region 130 may overlap, and a portion of the second region 130 and a portion of the third region 140 may overlap. The first region 120 and the third region 140 may not overlap.

The displacement between the center of the first region 120 and the center of the second region 130 may be expressed by Equation 3, and the displacement between the center of the second region 130 and the center of the third region 140 may be expressed by Equation 4.

$$S1_x = \frac{S}{\Lambda_x}(\lambda_R - \lambda_G),$$ [Equation 3]
$$S1_y = \frac{S}{\Lambda_y}(\lambda_R - \lambda_G)$$

$$S2_x = \frac{S}{\Lambda_y}(\lambda_G - \lambda_B),$$ [Equation 4]
$$S2_y = \frac{S}{\Lambda_y}(\lambda_G - \lambda_B)$$

wherein S refers to the distance from the light source 11 to the focusing optical system 13.

Figure 6:
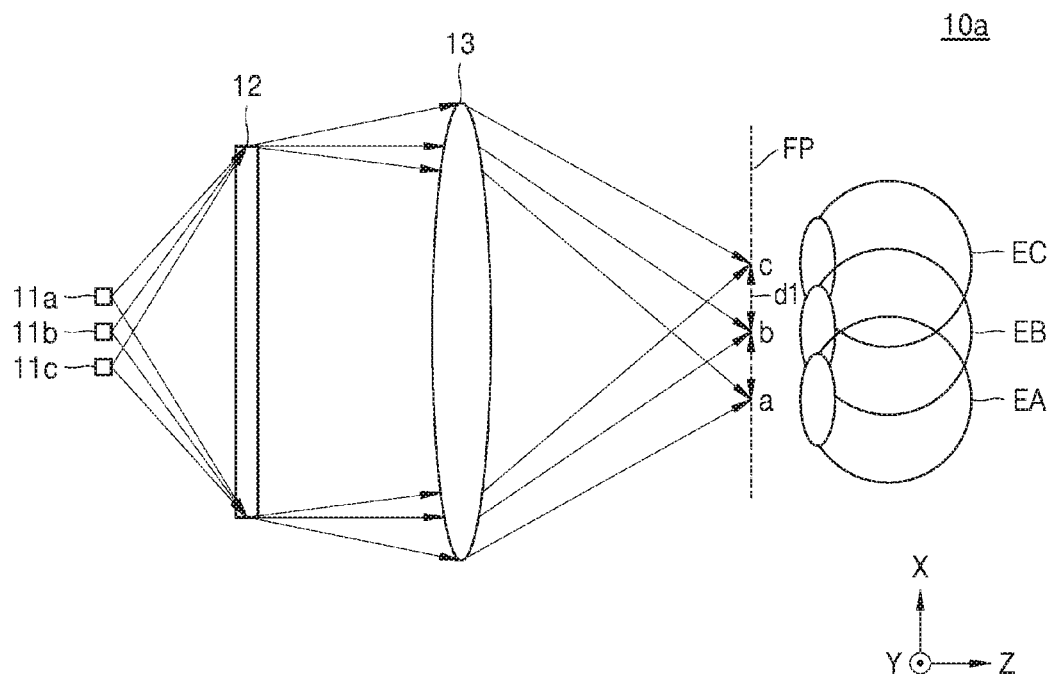
FIG. 6 shows a view illustrating a holographic display apparatus including a plurality of light sources according to an example embodiment.

A holographic display apparatus according to an example embodiment may include a plurality of light sources to enlarge a view window within which a viewer observes an image. FIG. 6 shows a view illustrating a holographic display apparatus 10a including a plurality of light sources 11a, 11b, and 11c.

Referring to FIG. 6, the holographic display apparatus 10a includes the light sources 11a, 11b, and 11c arranged to form focuses a, b, and c at different locations on a focal plane FP, the spatial light modulator 12 configured to modulate light emitted by the light sources 11a, 11b, and 11c according to the hologram data signal, the focusing optical system 13 configured to focus an image formed by the spatial light modulator 12 on a space, and the processor 14 configured to select and drive at least one of the light sources 11a, 11b, and 11c and controlling a modulation signal applied to the spatial light modulator 12.

The focuses a, b, and c may be spaced apart on the focal plane FP and, as illustrated in FIG. 6, may be formed in a direction (X direction) perpendicular to the direction of an optical axis (Z direction). The light sources 11a, 11b, and 11c may be arranged such that the distances d1 among the focuses a, b, and c may be similar to or greater than the size of the pupil. By arranging the light sources 11a, 11b, and 11c in such a manner, an appropriate light source may be selected according to the position of the eyes, thereby providing a wide viewing range.

The light sources 11a, 11b, and 11c illustrated in the drawing are arranged in the X direction, and example embodiments will be described in connection therewith. However, the number of light sources is not limited thereto. For example, the number of light sources may be greater than 3. The light sources may be arranged in a two-dimensional array. That is, the light sources may be arranged to be spaced in the X and Y directions in a plane (X-Y) perpendicular to the direction of the optical axis (Z direction). In this case, a plurality of focal points spaced in the X direction and the Y direction may also be formed on the focal plane FP, and the viewing range may be widened in two dimensions.

Each of the light sources 11a, 11b, and 11c may include a plurality of VCSELs spaced apart from each other. Each of the light sources 11a, 11b, and 11c may include VCSELs capable of emitting light having different wavelengths to produce the white balance. The size and output power of each of the light sources 11a, 11b, and 11c, and the sizes, output power, and arrangement of the VCSELs are the same as described above.

The light sources 11a, 11b, and 11c may be arranged to form different focuses a, b, and c spaced apart from each other on the focal plane FP near the user's eye. From among light sources 11a, 11b, and 11c, a light source that forms the focal point for providing the sharpest image in relationship to user's eyes EA, EB, and EC which may be at different positions corresponding to the focuses a, b, and c placed at different positions, may be selected as a driving light source. To allow any one of the focuses a, b, and c to correspond to one pupil of the user's eyes EA, EB, and EC, the light sources 11a, 11b, and 11c may be arranged such that d1, that is, the distances among adjacent focuses a, b, and c, may be similar to or greater than the size of the pupil. The focus of one pupil corresponds to one of a plurality of light sources, which is selected as a driving light source to form a hologram image. However, d1 is not limited thereto. The distance d1 may be about 2 mm or more. The distance d1 may be about 4 mm or more and about 10 mm or less.

In FIG. 6, the focal plane FP is illustrated as being located far from the pupil of the user's eyes EA, EB, and EC, but this is an example. In one or more example embodiments, the focal plane FP may be formed near the pupil. For example, the focal plane FP may be formed inside the pupil. That is, the focal plane FP may be the pupil plane.

From among the light sources 11a, 11b, and 11c, a light source that forms a focus near the user's eyes EA, EB, and EC placed at various positions may be selected as a driving light source for forming a holographic image. For example, when the position of the user's eye corresponds to user's eye EA, the light source 11a that forms a focus at a position closest to the user's eye EA is selected as a driving light source. That is, the light sources 11b and 11c are turned off, and only the light source 11a is turned on, and a holographic image is formed by using light from the light source 11a.

The processor 14 may control the overall operation of the holographic display apparatus 10. The processor 14 may control the light sources 11a, 11b, and 11c and the spatial light modulator 12 such that one or more of the light sources 11a, 11b, and 11c are selected depending on where the user's eyes EA, EB, and EC are located and a holographic image is formed by using the selected light sources. For example, the processor 14 may control the light sources 11a, 11b, and 11c and the spatial light modulator 12 such that the light sources 11a, 11b, and 11c are sequentially turned on and the spatial light modulator 12 modulates light emitted by each of the light sources 11a, 11b, and 11c to form the focuses a, b, and c on the focal plane FP. In one or more example embodiments, from among the light sources 11a, 11b, and 11c, a light source which forms a focus on the pupil of the user may be used as a driving light source.

Once the driving light source is selected, the processor 14 may turn off a light source that is not selected and turn on only the driving light source that is selected, so that the spatial light modulator 12 forms a holographic image by using light from the driving light source.

Figure 7:
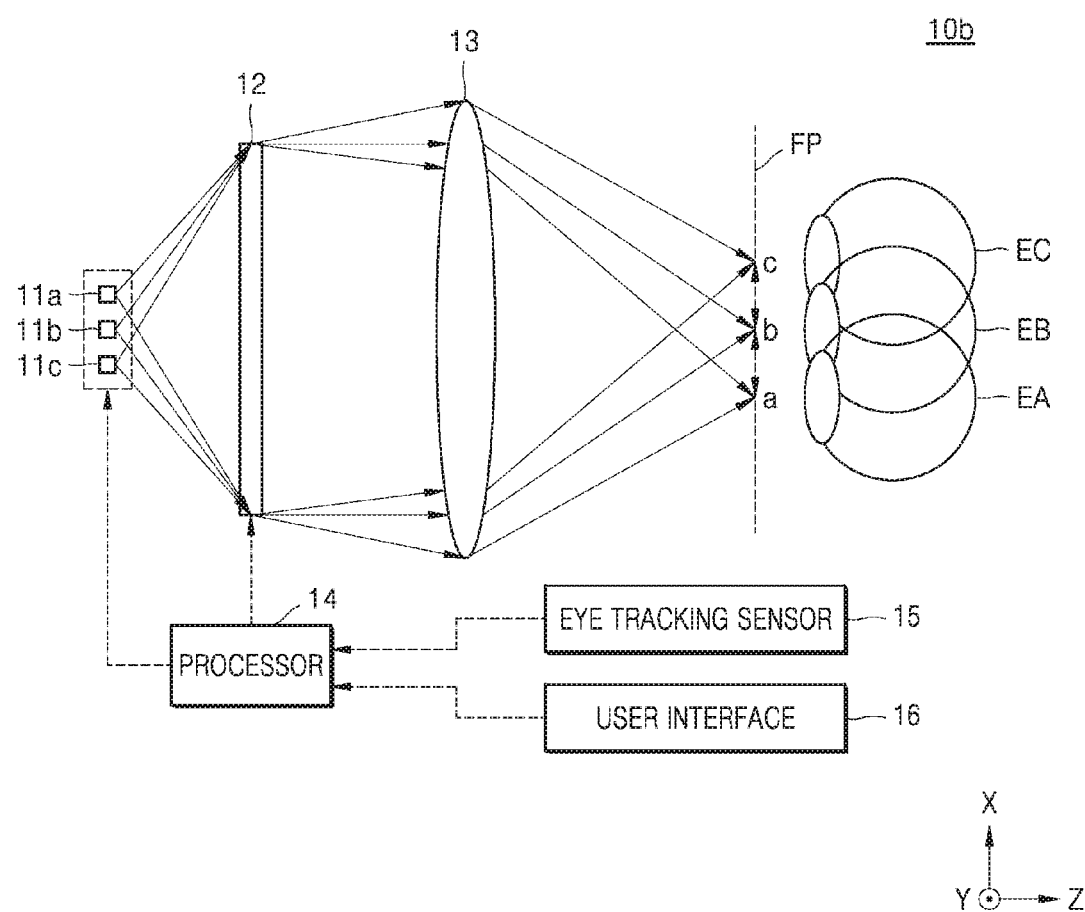
FIG. 7 shows a view illustrating an optical arrangement of a holographic display apparatus according to an example embodiment.

FIG. 7 shows a view showing an optical arrangement of a holographic display apparatus 10b according to another example embodiment;

The holographic display apparatus 10b may further include an eye-tracking sensor 15 and/or a user interface 16 in the holographic display apparatus 10a of FIG. 6.

The eye-tracking sensor 15 may sense an amount of light reflected when the light sources 11a, 11b, and 11c are sequentially turned on to form the focuses a, b, and c. The processor 14 may select a driving light source based on a signal detected by the eye-tracking sensor 15. For example, the processor 14 may select a light source that operates when a frontal reflection amount is the greatest, based on the signal sensed by the eye-tracking sensor 15.

The processor 14 may also select a driving light source according to a signal that is input by the user via the user interface 16. The user may select a point at which the sharpest image is provided, when the light sources 11a, 11b, and 11c are sequentially turned on and a plurality of focuses a, b, and c are formed. The processor 14 may select, as a driving light source, a light source which operates based on the user's selection.

Figure 8:
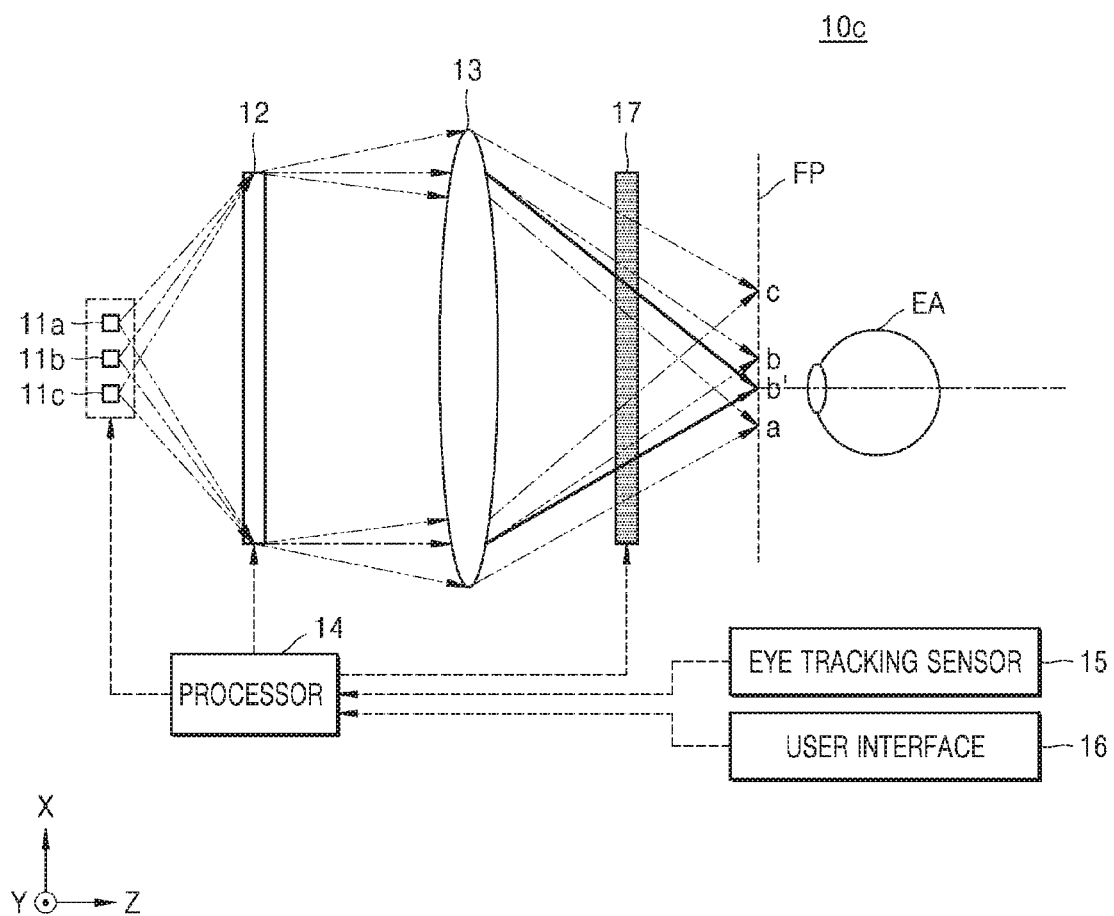
FIG. 8 shows a view illustrating an optical arrangement of a holographic display apparatus according to an example embodiment.

FIG. 8 shows a view showing an optical arrangement of a holographic display apparatus 10c according to another example embodiment.

The holographic display apparatus 10c according to the present example embodiment differs from the holographic display apparatus 10b of FIG. 7 in that holographic display apparatus 10c further includes a beam steering device 17.

At the position of the user's eye EA, when none of the focal points a, b, c corresponds to the pupil, the beam steering device 17 may be used to finely tune the focal position. The beam steering device 17 may adjust the direction of a beam so that the focus b is moved to a focus b'. The beam steering device 17 is illustrated as located between the focusing optical system 13 and the focal plane FP. However, the position of the beam steering device 17 is not limited thereto. In one or more example embodiments, the beam steering device 17 may be located between the light sources 11a, 11b, and 11c and the spatial light modulator 12.

The beam steering device 17 illustrated in FIG. 8 steers light in the X direction perpendicular to the optical axis direction (Z direction), but the direction in which the beam steering device 17 steers light is not limited thereto. The beam steering device 17 may steer a beam in the X and Y directions, and finely adjust the focal position two-dimensionally.

During the initial operation in which the light sources 11a, 11b, and 11c are sequentially turned on to form the focuses a, b, and c, when a clear image is not recognized at any focal position, based on a signal that is input by a user via the user interface 16 or a signal detected by the eye-tracking sensor 15, the processor 14 may drive the beam steering device 17 to finely adjust the positions of the focuses a, b, and c.

Figure 9:
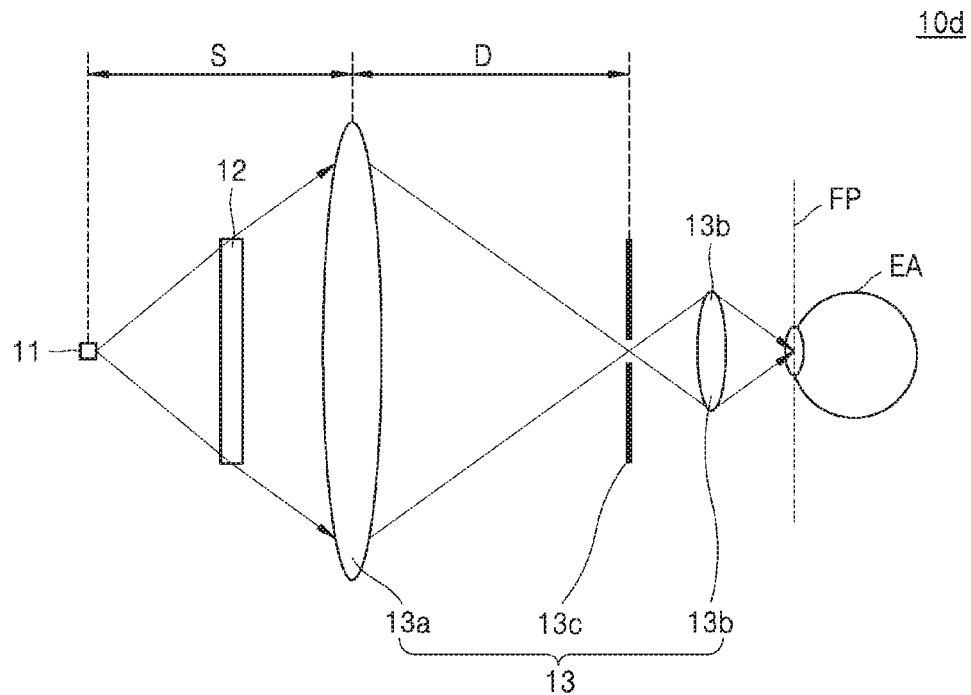
FIG. 9 shows a view illustrating an optical arrangement of a holographic display apparatus according to an example embodiment.

FIG. 9 shows a view showing an optical arrangement of a holographic display apparatus 10d according to another example embodiment. The holographic display apparatus 10d according to the present example embodiment includes a focusing optical system that differs from the focusing optical system 13 according to the example embodiments described above.

The focusing optical system 13 may include a spatial filter 13c. The spatial filter 13c may be used to remove unwanted noise generated when light is modulated by the spatial light modulator 12.

When light is modulated by the spatial light modulator 12, unwanted noise may occur. A spatial light modulator may include an array of a plurality of pixels. Accordingly, the array of a plurality of pixels acts as a lattice. Therefore, for example, when the spatial light modulator 12 forms a hologram pattern for forming a hologram image, the incident light is diffracted not only by a hologram pattern but also by a pixel lattice including an array of pixels of the spatial light modulator 12. In addition, some of the incident light passes through the spatial light modulator 12 without being diffracted by the hologram pattern. As a result, many lattice spots appear on the focal plane FP of the focusing optical system 13 where the holographic image is gathered into a point. These multiple lattice spots act as image noise that degrades the quality of the holographic image and makes viewing of the holographic image uncomfortable.

To block such noise, a hologram image may be formed where lattice spots are not formed such that the lattice spots are not viewed by a viewer. The spatial light modulator 12 may further form, in addition to the hologram pattern including information about the hologram image to be reproduced, a periodic diffraction pattern for adjusting a focal position of the hologram image. The traveling direction of the incident light is deflected by the periodic diffraction pattern displayed on the spatial light modulator 12. Accordingly, the focal position of the holographic image may be displaced from the lattice spots. However, when the focal position of the holographic image is moved in this way, an undesirable complex conjugate image may appear at a position symmetric to the holographic image with respect to a lattice spot that may contribute to the image noise.

The spatial filter 13c may be configured to block lattice spots and the complex conjugate image and pass only the hologram image. As a result, the noise image generated due to the lattice spots and the complex conjugate image may be invisible or less visible to the viewer. The spatial filter 13c may include a plurality of apertures for passing a plurality of hologram images. Although FIG. 9 illustrates that the number of apertures is the same as the number of the light source 11, the number of apertures illustrated is an example only and not limited. To remove noise generated when light emitted by each of the light sources 11a, 11b, and 11c is modulated by the spatial light modulator 12, apertures may be formed, in the spatial filter 13c, in a number corresponding to the number of light sources 11a, 11b, and 11c. That is, the spatial filter 13c may have apertures in a number greater than the number of light sources.

The focusing optical system 13 may include a first lens 13a and a second lens 13b for focusing light on the focal plane FP, and the spatial filter 13c may be located between the first lens 13a and the second lens 13b. The spatial filter 13c may be located on the focal plane of the first lens 13a. In this case, the positions of apertures of the spatial filter 13c may match with the focal positions of hologram images. The number of lenses illustrated is an example only and not limited.

Figure 10:
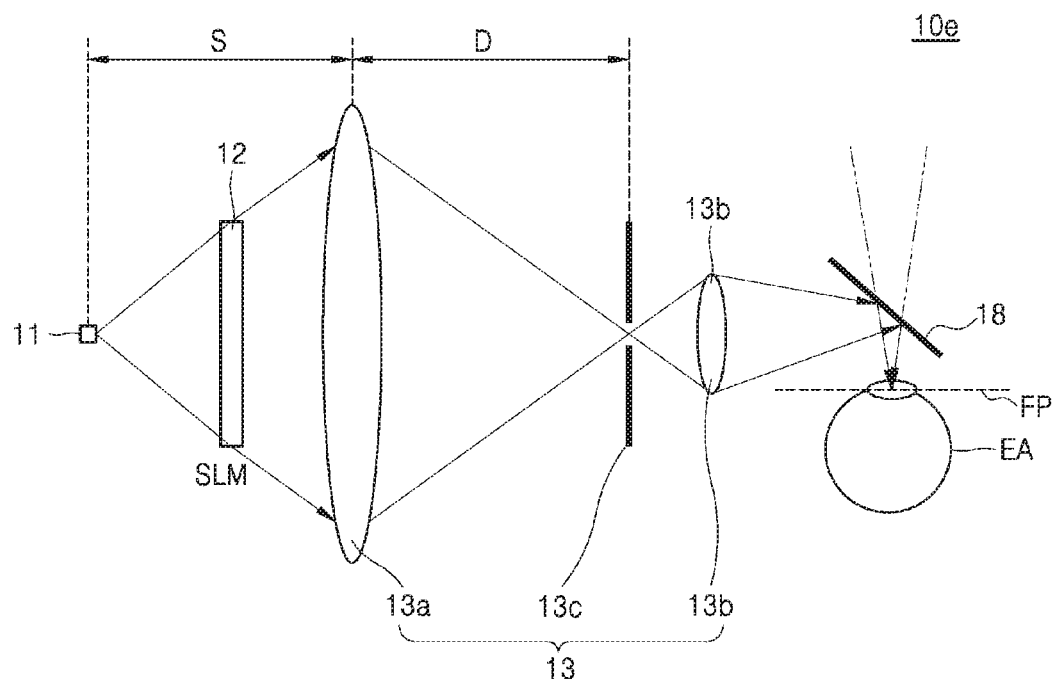
FIG. 10 shows a view illustrating an optical arrangement of a holographic display apparatus according to an example embodiment.

FIG. 10 shows a view showing an optical arrangement of a holographic display apparatus 10e according to another example embodiment. The holographic display apparatus 10e of FIG. 10 is different from that of FIG. 9 in that the holographic display apparatus 10e further includes an image converging element 18 for focusing both a holographic image and an image of a real environment.

The image converging element 18 may change an optical path of at least one of the holographic image and the image of the real environment to converge the holographic image and the image of the real environment into one region. The image converging element 18 may transmit a plurality of images to the viewer's pupil.

For example, light corresponding to a holographic image may be reflected by the image converging element 18, and light corresponding to the image of the real environment may be transmitted through the image converging element 18. The image converging element 18 may be a transflective element having light transmission and light reflection characteristics. In an example embodiment, the image converging element 18 may include a beam splitter or a transflective film. Although the image converging element 18 illustrated in FIG. 10 is a beam splitter, an example of the image converging element 18 is not limited thereto.

The holographic display apparatuses described above may be configured in a wearable form. All or a part of the components of the holographic display apparatuses may be configured in a wearable manner.

For example, holographic display apparatuses may be applied in the form of a head mounted display (HMD). In one or more example embodiments, holographic display apparatuses according to example embodiments are not limited thereto, and may be applied in the form of a glasses-type display or a goggle-type display.

The above-described holographic display apparatuses may operate in engagement with or connected to other electronic apparatuses such as a smartphone. For example, a processor for a holographic display apparatus may be provided in a smartphone. In one or more example embodiments, the smartphone itself may be used as a holographic display apparatus by providing the above-described holographic display apparatus in the smartphone.

Figure 11:
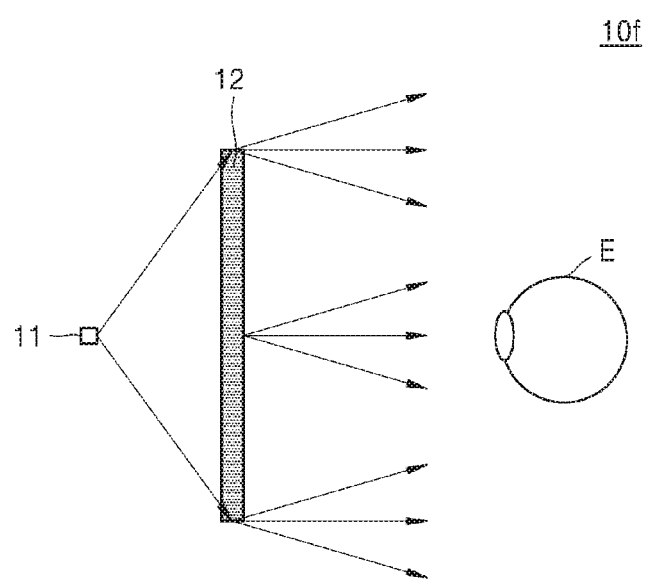
FIG. 11 shows a view of a holographic display apparatus according to an example embodiment.

FIG. 11 shows a view of a holographic display apparatus 10f according to another example embodiment. When a pixel pitch included in the spatial light modulator 12 illustrated in FIG. 11 is small, a light source including VCSELs may be applied to a spectacle-free holographic display apparatus.

The example embodiments provide a small light source that includes a plurality of VCSELs spaced apart from one another, thereby reducing image noise.

Hereinbefore, example embodiments have been described and shown in the accompanying drawings to facilitate understanding of the present disclosure. It should be understood, however, that such embodiments are merely provided herein for illustrative purposes only, and do not limit the present disclosure. The present disclosure is not limited to the descriptions provided and illustrated. This is because various other variations may be made by those of ordinary skill in the art.

What is claimed is:

1. A holographic display apparatus comprising:
   a light source configured to emit light, the light source comprising a plurality of vertical-cavity surface-emitting lasers (VCSELs) that are spaced apart from one another;
   a spatial light modulator configured to, based on a hologram data signal, modulate the light emitted by the light source; and
   a focusing optical system configured to focus an image formed by the spatial light modulator using a Maxwellian view method,
   wherein the plurality of VCSELs comprises:
      a plurality of first VCSELs arranged entirely within a first region and configured to emit light having a first wavelength;
      a plurality of second VCSELs arranged entirely within a second region and configured to emit light having a second wavelength that is different from the first wavelength; and
      a plurality of third VCSELs arranged entirely within a third region and configured to emit light having a third wavelength that is different from the first wavelength and the second wavelength,
   wherein the first region overlaps the second region without overlapping the third region.

2. The holographic display apparatus of claim 1, wherein the light source is configured to output power of 20 mW or more.

3. The holographic display apparatus of claim 1, wherein at least one VCSEL of the plurality of VCSELs is configured to output power in a range of 5 µW to 5 mW.

4. The holographic display apparatus of claim 1, wherein the light source has a cross-section in a shape of a circle with a diameter of 500 µm or less.

5. The holographic display apparatus of claim 1, wherein at least one VCSEL of the plurality of VCSELs has a cross-section in a shape of a circle with a diameter of 5 µm or more and 50 µm or less.

6. The holographic display apparatus of claim 1, wherein at least some VCSELs of the plurality of VCSELs are arranged in at least one of a polygon shape, an ellipse shape, a circle shape, and a shape of concentric circles.

7. The holographic display apparatus of claim 1, wherein each VCSEL of the plurality of VCSELs is configured to emit light having a wavelength that is different from a wavelength of light emitted by at least two neighboring VCSELs.

8. The holographic display apparatus of claim 1, wherein the first wavelength, the second wavelength, and the third wavelength are a red wavelength, a green wavelength, and a blue wavelength, respectively.

9. The holographic display apparatus of claim 1, wherein the plurality of first VCSELs, the plurality of second VCSELs, and the plurality of third VCSELs are arranged to emit light to produce a white balance.

10. The holographic display apparatus of claim 1, wherein the light source comprises a region in which the first VCSELs, the second VCSELs, and the third VCSELs are arranged such that a sequence of a first VCSEL from among the plurality of first VCSELs, a second VCSEL from among the plurality of second VCSELs, and a third VCSEL from among the plurality of third VCSELs is repeated in one direction.

11. The holographic display apparatus of claim 1, wherein a distance between a center of the first region and a center of the second region is proportional to a difference between the first wavelength and the second wavelength.

12. The holographic display apparatus of claim 1, wherein the first region, the second region, and the third region are sequentially arranged in one direction.

13. The holographic display apparatus of claim 1, wherein the focusing optical system comprises:
   a first lens;
   a second lens; and
   a spatial filter between the first lens and the second lens.

14. The holographic display apparatus of claim 1, wherein the light source further comprises:
- a first light source comprising a plurality of first VCSELs spaced apart from each other; and
- a second light source comprising a plurality of second VCSELs spaced apart from each other, and wherein the holographic display apparatus further comprises:
- an eye-tracking sensor; and
- a processor configured to select one of the first light source and the second light source based on a detection result obtained by the eye-tracking sensor and operate the selected one of the first light source and the second light source.

15. The holographic display apparatus of claim 14, wherein the focusing optical system is configured to:
- focus a first image formed based on light emitted from the first light source on a first position on a focal plane, and
- a second image formed based on light emitted from the second light source on a second position on the focal plane, the second position being different from the first position.

16. The holographic display apparatus of claim 15, wherein a distance between the first position and the second position is 2 mm or greater and 10 mm or less.

17. The holographic display apparatus of claim 1, wherein the focusing optical system further comprises an image converging element configured to focus a first image of an external environment and a second image formed by the spatial light modulator.

18. The holographic display apparatus of claim 1, wherein the holographic display apparatus is a head mount display.

* * * * *